US006507928B1

(12) United States Patent
Richardson

(10) Patent No.: US 6,507,928 B1
(45) Date of Patent: Jan. 14, 2003

(54) PROCESSOR CACHE SYSTEM WITH PARITY PROTECTION AND METHOD OF OPERATION

(75) Inventor: Nicholas J. Richardson, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/531,251

(22) Filed: Mar. 17, 2000

(51) Int. Cl.[7] ........................ G06F 11/10; H03M 13/00
(52) U.S. Cl. ...................................... 714/800; 714/801
(58) Field of Search .................. 714/800, 801; 711/3

(56) References Cited

U.S. PATENT DOCUMENTS 5,749,090 A * 5/1998 Feng et al. ................. 711/135
5,914,970 A * 6/1999 Gunsaulus et al. ......... 714/801

* cited by examiner

*Primary Examiner*—Phung M. Chung
(74) *Attorney, Agent, or Firm*—Lisa K. Jorgenson; William A. Munck

(57) ABSTRACT

There is disclosed a cache memory for use in a data processor. The cache memory comprises a first static random access memory (SRAM) that receives up to N incoming bytes of data on an input bus and that stores the up to N incoming bytes of data in an N-byte addressable location. M incoming bytes of data may be written in each of the N-byte addressable locations during a write operation (where M may be less than N) and the M written bytes of data and N–M unwritten bytes of data are output from each N-byte addressable location on an output bus of the first SRAM during each write operation. The cache memory also comprises a parity generator coupled to the first SRAM that receives the M written bytes of data and the N–M unwritten bytes of data and generates at least one write parity bit associated with the M written bytes of data and the N–M unwritten bytes of data.

22 Claims, 5 Drawing Sheets

PROCESSOR CACHE SYSTEM WITH PARITY PROTECTION AND METHOD OF OPERATION

TECHNICAL FIELD OF THE INVENTION

The present invention is directed, in general, to data processing systems and, more specifically, to a cache system having high performance parity protection.

BACKGROUND OF THE INVENTION

The demand for high performance computers requires that state-of-the-art microprocessors execute instructions in the minimum amount of time. A number of different approaches have been taken to decrease instruction execution time, thereby increasing processor throughput. One way to increase processor throughput is to use a pipeline architecture in which the processor is divided into separate processing stages that form the pipeline. Instructions are broken down into elemental steps that are executed in different stages in an assembly line fashion.

Superpipelining refers to the simultaneous processing of multiple instructions in the pipeline. For example, if a processor executes each instruction in five stages and each stage requires a single clock cycle to perform its function, then five separate instructions can be processed simultaneously in the pipeline, with the processing of one instruction completed during each clock cycle. Hence, the instruction throughput of an N stage pipelined architecture is, in theory, N times greater than the throughput of a non-pipelined architecture that completes only one instruction every N clock cycles.

Instructions are fed into the instruction pipeline from a cache memory. A cache memory is a small but very fast memory, such as a static random access memory (SRAM), that holds a limited number of instructions and data for use by the processor. The lower the cache access time, the faster the processor can run. Also, the lower the cache miss rate, the less often the processor is stalled while the requested data is retrieved from main memory and the higher the processor throughput is.

It is common practice to provide parity protection for integrated SRAM caches in modern processor designs. Such processors typically contain two levels of cache (L1 and L2) integrated onto the same die as the core CPU logic. Presently, the size of integrated L2 caches is typically in the range of 64 KB to 256 KB. Unfortunately, the geometries of modern semiconductor technologies (0.25 micron and below) coupled with the relatively large amount of SRAM integrated on the chip makes integrated L2 caches subject to soft errors caused by spurious radiation (from cosmic-ray alpha particles and the like) and by statistical charge fluctuation in the SRAM cells. Soft errors cause one or more bits in a cache line to be randomly changed from a Logic 0 to a Logic 1 or vice versa. These soft errors can corrupt the data within the cache, which can in turn lead to permanent database corruption and catastrophic program failure.

Therefore, it is desirable to detect (and optionally to correct) soft errors in a given cache line in order to take corrective action before the soft errors can cause damaging program behavior. This is generally accomplished by associating one or more redundant SRAM cells (i.e., parity bits) for each group of data bits in the cache, the group size being chosen according to the degree of protection desired. For each possible value of the data bits in a group, the associated parity bit(s) must have one particular value that is calculated and written into memory at the same time as data is written into memory (on a CPU write transaction). If a soft error causes a change in value of either a parity bit or a data bit, then the value of the parity bits and the value of the data bits become inconsistent, which can be detected (and possibly corrected if the parity bits are used to hold an error-correcting code) when the cache line is read. A soft error detected in this way is often referred to as a "parity error."

By way of example, one of the most common parity schemes generates the parity bit value for a given set of data bits by making the parity bit a Logic 1 if there are an odd number of data bits set to Logic 1 and a Logic 0 if there are an even number of data bits set to Logic 1. Both the data bits and the parity bit are written into the cache on a CPU write transaction. In this example, there will always be an even number of bits set to Logic 1 (including the parity bit), hence this scheme is known as "even parity." If, at some later time, one of the data bits or the parity bit gets changed from a Logic 1 to a Logic 0, or a Logic 0 to a Logic 1, due to a soft error, there would be an odd number of bits set to Logic 1 (including the parity bit). This would be detected as a parity error when the data and parity bits are later read out the cache.

Unfortunately, the parity bits may significantly increase the size of the cache, depending on the ratio of the number of parity bits to the number of data bits. This can be a major drawback when applied to large on-chip L2 caches, which are already pushing the limits of technology. For instance, if one (1) parity bit is added for each eight (8) data bits, then the die area of the cache is increased by 12.5%, which may significantly increase the likelihood that a soft error occurs (since there are now many more SRAM cells that may fail).

For most non-critical applications of high speed microprocessors, a lesser level of protection is sufficient, such that a parity bit to data bit ratio smaller than 1:8 may be used. Unfortunately, this may conflict with the functional operations of certain caches that require an individual byte-write capability that matches the variable widths (typically 1 to 8 data bytes) of write transactions generated by the CPU. For instance, if one parity bit is used for every pair of data bytes in the data cache, then when the CPU modifies, for example, only the first byte in a byte-pair (on a one-byte write transaction), it would be impossible to calculate the correct new parity bit for the byte-pair without first reading the second byte in the pair from the cache. This would cause a performance penalty by slowing the write transaction. The same argument applies for any combination of parity bits and data bytes in which one parity bit protects more than one data byte.

Therefore, there is a need in the art for improved cache memories that maximize processor throughput. In particular, there is a need in the art for improved cache memories having parity protection in which one parity bit protects more that one data byte. More particularly, there is a need for a cache memory having a byte-write capability that uses a parity protection apparatus in which one parity bit protects more that one data byte without slowing down the operation of the cache memory.

SUMMARY OF THE INVENTION

To address the above-discussed deficiencies of the prior art, it is a primary object of the present invention to provide an improved cache memory for use in a data processor. According to an advantageous embodiment of the present invention, the cache memory comprises: 1) a first static random access memory (SRAM) capable of receiving on a plurality of inputs up to N incoming bytes of data and storing the up to N incoming bytes of data in a plurality of N-byte addressable locations, wherein M incoming bytes of data may be written in each of the plurality of N-byte addressable locations during a write operation, and wherein M written bytes of data and N−M unwritten bytes of data are output from each N-byte addressable location on a plurality of outputs of the first SRAM during the write operation; and 2) a parity generator coupled to the first SRAM capable of receiving during the write operation the M written bytes of data and the N–M unwritten bytes of data and generating therefrom at least one write parity bit associated with the M written bytes of data and the N–M unwritten bytes of data.

According to one embodiment of the present invention, the cache memory further comprises a second SRAM coupled to the parity generator capable of storing the at least one write parity bit during the write operation.

According to another embodiment of the present invention, the first SRAM receives R write enable signals capable of selecting at least one of N bytes in each of the plurality of N-byte addressable locations in which incoming bytes of data are to be written.

According to still another embodiment of the present invention, R=N such that a single incoming byte of data may be written into an individual selectable one of the N bytes in each of the plurality of N-byte addressable locations.

According to yet another embodiment of the present invention, the at least one write parity bit comprises a single parity bit associated with the M written bytes of data and the N–M unwritten bytes of data.

According to a further embodiment of the present invention, the at least one write parity bit comprises a first parity bit associated with a first one of N bytes in each of the plurality of N-byte addressable locations and a second parity bit associated with a second one of the N bytes in each of the plurality of N-byte addressable locations.

According to a still further embodiment of the present invention, the first SRAM is capable of receiving during a read operation a read address selecting a first one of the plurality of N-byte addressable locations, wherein the first SRAM, in response to receipt of the read address, outputs on the plurality of outputs N bytes of data retrieved from the first N-byte addressable location, and wherein the parity generator generates at least one read parity bit associated with the retrieved N bytes of data.

According to a yet further embodiment of the present invention, the cache memory further comprises a parity error detector, wherein the second SRAM receives the read address and, in response to receipt of the read address, outputs the at least one write parity bit associated with the read address, and wherein the parity detector compares the at least one read parity bit and the at least one write parity bit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OR THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processor.

Figure 1:
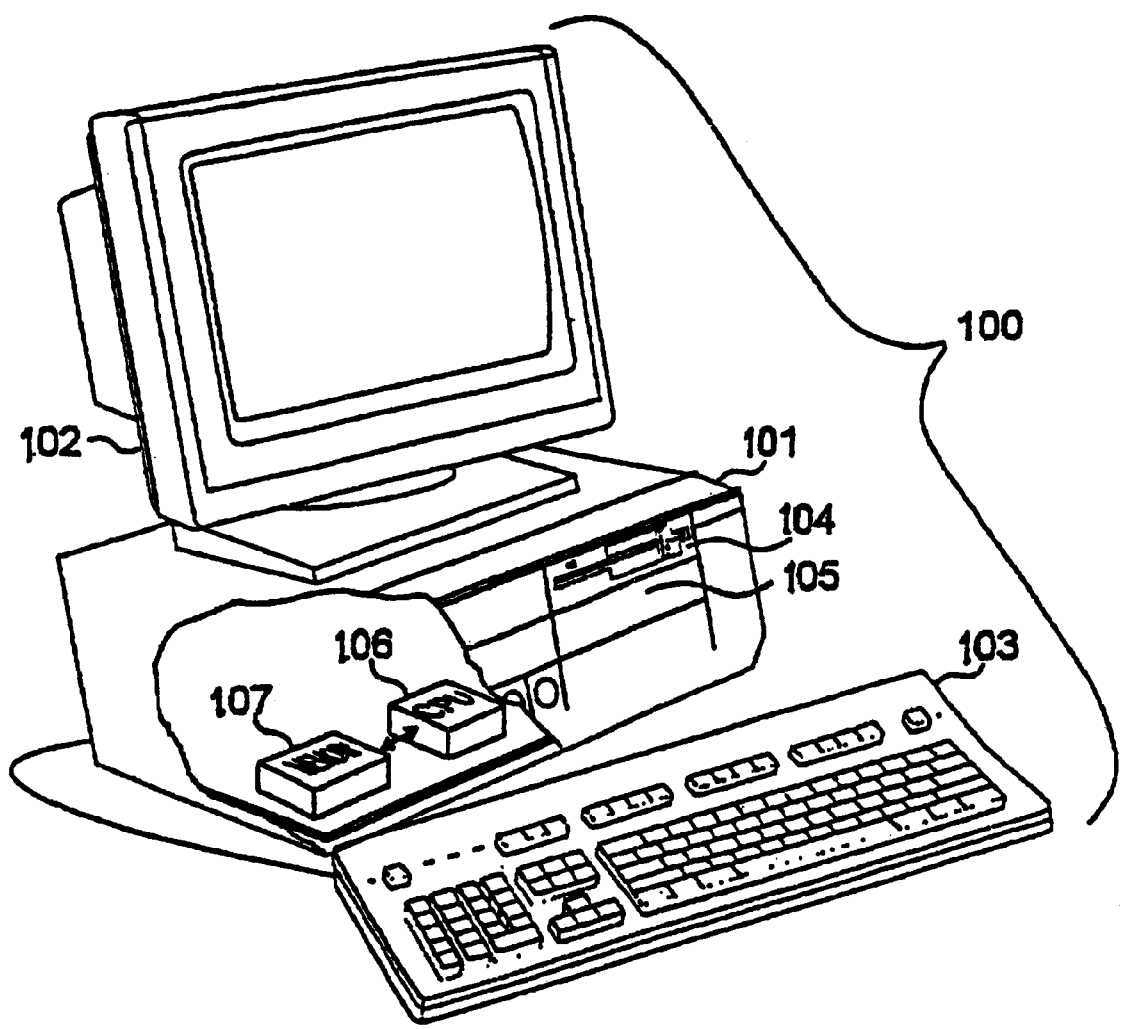
FIG. 1 illustrates an isometric view of an exemplary processing system, namely a personal computer, that implements an improved cache memory in accordance with the principles of the present invention.

FIG. 1 illustrates an isometric view of an exemplary processing system, namely personal computer 100, that implements an improved cache memory in accordance with the principles of the present invention. Personal computer 100 comprises chassis 101, monitor 102 and keyboard 103. Monitor 102 and keyboard 103 may be replaced by, or combined with, other input/output (I/O) devices. Chassis 101 is illustrated with a cutaway view that shows floppy disk drive 104 and hard disk drive 105. Floppy disk drive 104 is capable of reading and writing to removable floppy diskettes. Hard disk drive 105 provides fast access data storage and retrieval.

Processor 106 (i.e., CPU) is illustrated within the cutaway portion of chassis 101. Processor 106 is coupled to memory storage device 107. Memory storage device 107 may be any conventional suitably arranged memory storage device, including without limitation random access memory (RAM), read only memory (ROM), and the like. In alternate embodiments, personal computer 100 may suitably be equipped with a plurality of processing units and/or suitably arranged memory storage devices, or any combination thereof.

In an exemplary embodiment of the present invention, processor 106 comprises an on-board two level cache system, including a Level 1 (L1) cache and a Level 2 (L2) cache. The two level cache is a system in which a small, fast cache (the L1 cache) is connected to a slower, larger cache (the L2 cache). When the CPU core logic of processor 106 reads or writes data to or from a memory location, the cache system first tests to see if the data belonging to that location is in the L1 cache. If the data is in the L1 cache, then the data is provided or updated quickly by the L1 cache. If the data is not in the L1 cache, then an L1 cache read "miss" or an L1 cache write "miss" has occurred. The data is then provided or updated to the CPU core logic by the L2 cache. In the case of an L1 cache read miss, the line containing the requested data is also transferred from the L2 cache to the L1 cache, so that the data may be provided more quickly the next time processor 106 accesses the data. This is known as an L1 cache line fill. If the data is also not in the L2 cache, then an L2 cache miss has occurred and the line containing the requested data is fetched from main memory and then loaded into the L2 cache for faster access the next time the data is requested. This is known as an L2 cache line fill.

Figure 2:
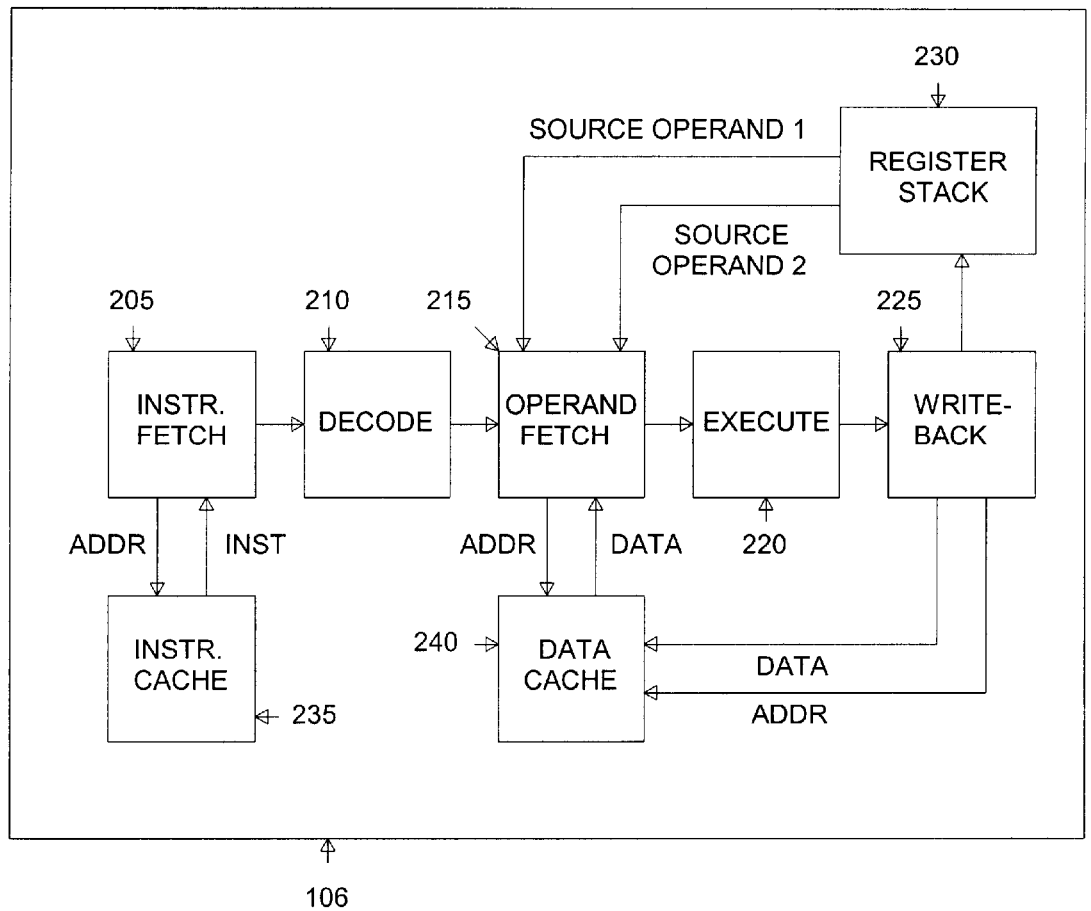
FIG. 2 illustrates in greater detail an exemplary processor according to one embodiment of the present invention.

FIG. 2 illustrates in greater detail exemplary processor 106 according to one embodiment of the present invention. Processor 106 contains an instruction pipeline comprising instruction fetch (IF) stage 205, decode stage 210, operand fetch stage 215, execute stage 220, and write-back stage 225. Processor 106 also comprises register stack 230, instruction (INSTR.) cache 235 and data cache 240.

Processor 106 is a central processing unit (CPU) capable of fetching and interpreting instructions, retrieving data, executing instructions, and storing results. The illustrated instruction pipeline is a mechanism capable of executing several different operations concurrently. The pipeline does this by breaking down the processing steps for each major task into several discrete processing phases, each of which is executed by a separate pipeline stage. Each task must pass sequentially through each processing phase, and hence each pipeline stage, to complete its execution.

Instruction fetch stage 205 fetches instructions to be executed from instruction cache 235 and stores the fetched instructions in an instruction fetch buffer (IFB). The instructions taken from the IFB by decode stage 210 are encoded in a highly compact form. Decode stage 210 decodes the instructions into larger sets of signals that can be used directly for execution by subsequent pipeline stages. Operand fetch stage 215 fetches operands from memory or from register stack 230. Execute stage 220 performs the actual operation (e.g., add, multiply, divide, and the like) on the operands fetched by operand fetch stage 215 and generates the result. Write-back stage 225 writes the result generated by execute stage 220 into data cache 240 or into one of the registers in register stack 230.

Figure 3:
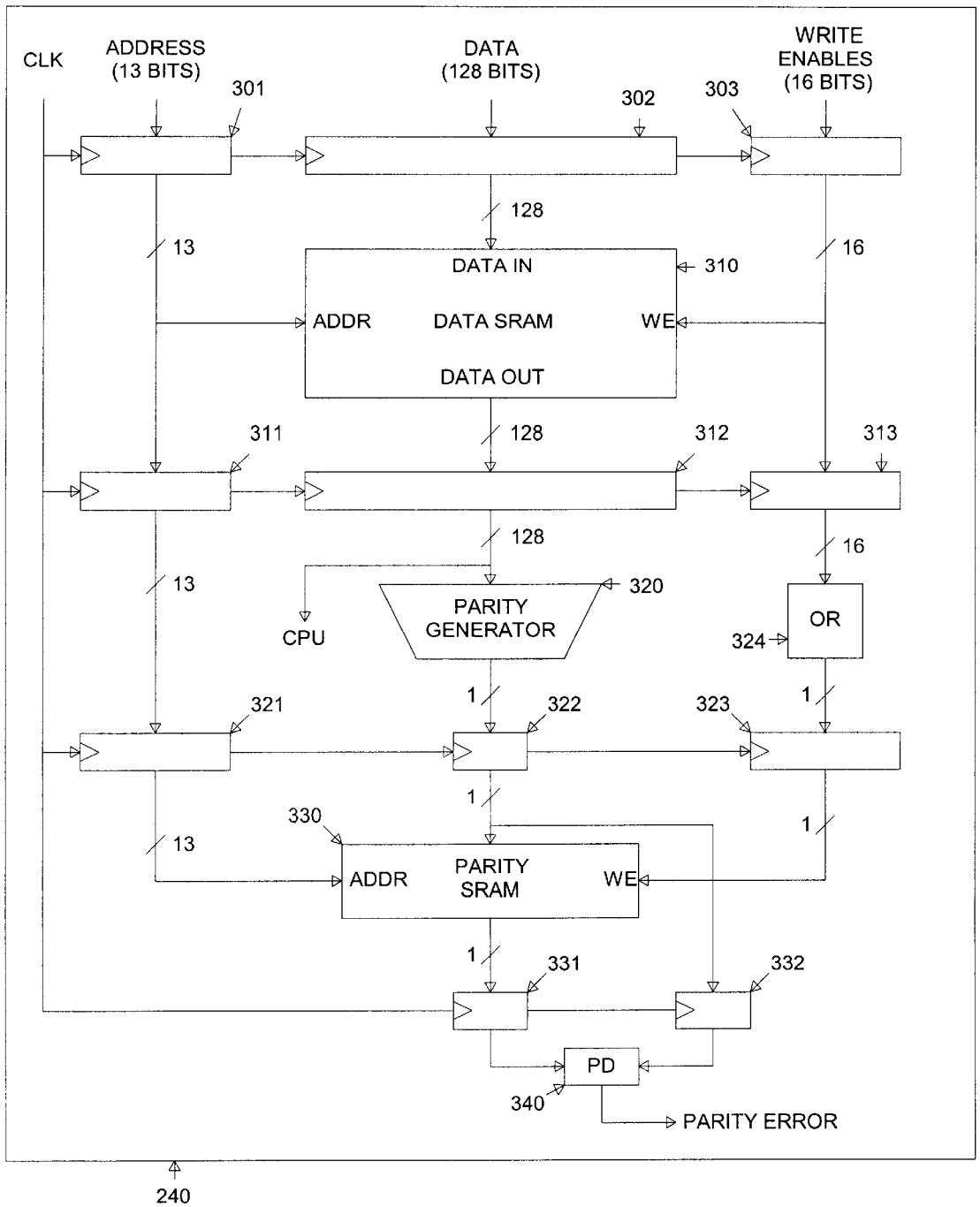
FIG. 3 illustrates an exemplary data cache in greater detail according to one embodiment of the present invention.

FIG. 3 illustrates exemplary data cache 240 in greater detail according to one embodiment of the present invention. Data cache 240 comprises data static random access memory (SRAM) 310 and parity SRAM 330 coupled together in a five-stage pipeline. In the exemplary embodiment, data SRAM 310 and parity SRAM 330 each comprise 8192 locations addressed by 13 address lines. Each location in data SRAM 310 stores 128 bits (i.e., 16 bytes) of data. Each location in parity SRAM 330 stores one parity bit. Data SRAM 310 has a byte-write capability. Data may be written into individual bytes in each location of data SRAM 310 by selecting individual bytes using one of sixteen (16) write enable (WE) signals.

Those skilled in the art will understand that the number of locations in data SRAM 310 and parity SRAM 330, and the number of data bits in each location are by way of example only. Similarly, the number of bytes that may be written in data SRAM 310 also is illustrative only. In alternate embodiment of the present invention, data SRAM 310 and parity SRAM 330 may contain more locations or less locations and either may store more or less data bits or parity bits at each location. It will be appreciated that these alternate embodiments do not depart from the spirit and scope of the invention in its broadest form.

The first stage of the pipeline comprises input registers 301–303, which are synchronized by a clock (CLK) signal. In the exemplary embodiment, input register 301 receives a 13-bit address that is used to read data to, or to write data from, the selected location. Input register 302 receives 128 bits (i.e., 16 bytes) of data that are written to the selected location during a write operation. Input register 303 receives 16 write enable (WE) signals, one for each of the 16 bytes of data, thus giving data SRAM 310 a byte-write capability.

The second stage of the pipeline comprises data SRAM 310, which receives a 13-bit address from input register 301, 128 bits of data from input register 302, and 16 WE signals from input register 303. In an advantageous embodiment of the present invention, data SRAM 310 is a "transparent-write" SRAM. A transparent-write SRAM is an SRAM with separate input and output data pins. When new data is applied to the input pins of the transparent-write SRAM and is written into at least some of the data bits at a given addressed location, the same data automatically appears on the output pins of the transparent-write SRAM after some fixed delay from the start of the write operation. This occurs without a separate read operation being performed. In addition, data from any unmodified data bits at the same addressed SRAM location also appear on the output pins of the transparent-write SRAM at the same time as the new data from the modified data bits.

For example, if a transparent-write SRAM contains a number of 16-bit locations, and hence has 16 input pins and 16 output pins, and an 8-bit write transaction modifies only 8 bits of a selected location, then after a delay from the start of the write transaction, the full 16 bits of data from the modified location will appear at the output pins of the transparent-write SRAM. Of the 16 bits of data on the output, 8 bits will reflect the new data supplied by the 8-bit write transaction and the other 8 bits will be unchanged from their previous value in that addressed location.

The third stage of the pipeline comprises registers 311–313, which are synchronized by a clock (CLK) signal. Register 311 also receives the 13-bit address that is used to read data to, or to write data from, the selected location in data SPAM 310. Register 312 receives 128 bits (i.e., 16 bytes) of data from the output of data SRAM 310 during read and write operations. Register 313 receives the 16 write enable (WE) signals used by data SRAM 310.

The third stage of the pipeline also comprises parity generator 320 and OR gate 324. The 128 bits of data at the output of register 312 are read by the CPU logic portion of processor 106 during a read operation and also form the input to parity generator 320. Parity generator 320 generates (or calculates) a single parity bit for the entire 128 bits of data received from data SRAM 310 during a read operation or during a write operation. The one bit output of OR gate 324 is a Logic 1 if any of the 16 write enable (WE) signals received from register 313 is a Logic 1.

The fourth stage of the pipeline comprises registers 321–323, which are synchronized by the CLK signal, and parity SRAM 330. Register 321 latches the 13 address bits at the output of register 311, register 322 latches the single parity bit at the output of parity generator 320, and register 323 latches the one bit output from OR gate 324. For each 128-bit data location addressed in data SRAM 310 during a write operation, the outputs of registers 321–323 are used to write the corresponding parity bit into the addressed location in parity SRAM 330. Similarly, for each 128-bit data location addressed in data SRAM 310 during a read operation, the outputs of registers 321–323 are used to read the corresponding parity bit from the addressed location in parity SRAM 330.

The fifth stage of the pipeline comprises output registers 331 and 332, which are synchronized by the CLK signal, and parity detector (PD) 340. Because data SRAM 310 is a transparent SRAM, a parity bit is generated (or calculated) by parity generator 320 during every read operation and during every write operation. The generated (calculated) parity bit is latched into register 332 during read and write operations. The output of parity SRAM 330 is latched into register 331 during read operations. The outputs of registers 331 and 332 are compared by parity detector 340 during read operations to detect parity errors.

Figure 4:
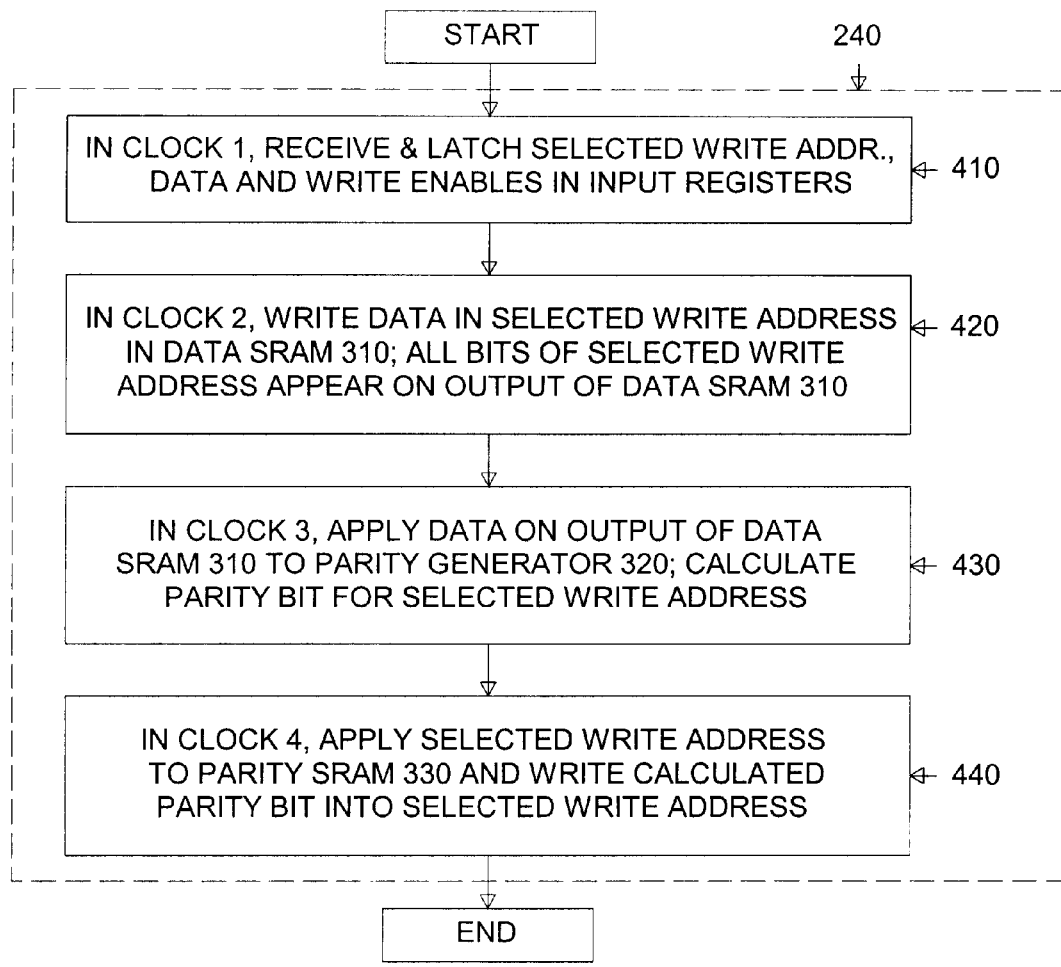
FIG. 4 is a flow diagram illustrating a write operation of the exemplary data cache according to one embodiment of the present invention.

FIG. 4 depicts flow diagram 400, which illustrates an exemplary write operation of exemplary data cache 240 according to one embodiment of the present invention. In clock period 1 of a write transaction, data cache 240 receives and stores in pipeline stage 1 a 13-bit address that identifies a data location in data SRAM 310, up to 16 bytes of data for storage in the addressed data location of data SRAM 310, and 16 write enable signals which identify which of the 16 bytes in the addressed data location in SRAM 310 are to receive the incoming write data (process step 410).

During clock period 2, the new data is written into the location in data SRAM 310 selected by the 13 bit address and at the bytes specified by the write enable signals. By the end of clock period 2, the newly written data bytes and the unchanged bytes, if any, in the selected location appear on the data output pins of data SRAM 310 (process step 420).

During clock period 3, pipeline stage 2 stores address bits, write enables and the output data from data SRAM 310. Parity generator 320 then calculates a parity bit for the data from data SRAM 310 and OR gate 324 generates a combined write enable signal (process step 430). During clock period 4, the write address, the combined write enable signal, and the newly calculated parity bit from parity generator 320 are stored in registers 321–323. When enabled by the combined write enable signal, parity SRAM 330 stores the calculated parity bit into the location identified by the 13-bit write address, thereby completing the write operation (process step 440).

Figure 5:
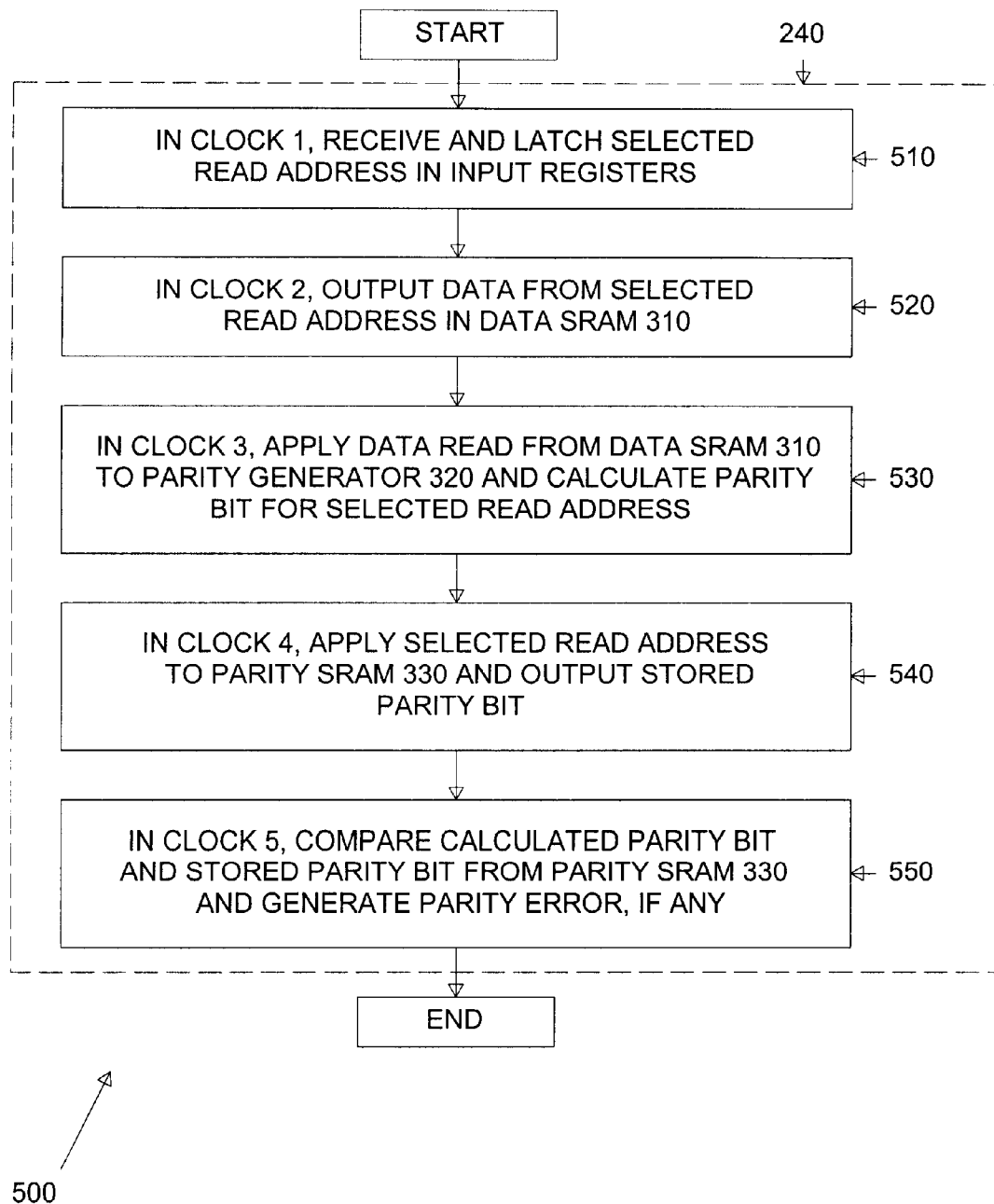
FIG. 5 is a flow diagram illustrating a read operation of the exemplary data cache according to one embodiment of the present invention.

FIG. 5 depicts flow diagram 500, which illustrates an exemplary read operation of exemplary data cache 240 according to one embodiment of the present invention. During clock period 1 of a read operation, data cache 240 receives and stores the 13-bit read address in input registers 301–303. No write enable signals are active for a read operation. The 13-bit read address selects the location in data SRAM 310 that is to be read by processor 106 (process step 510). During clock period 2, the address is applied to data SRAM 310 and data SRAM 310 outputs the desired data from the selected location (process step 520).

During clock period 3, data cache 240 stores the 13-bit read address, the output data from data SRAM 310, and the write enables in registers 311–313, respectively. Parity generator 320 then calculates a parity bit for the selected read data. The parity bit calculated by parity generator 320 is the same as the parity bit that should be stored in parity SRAM 330 for the selected read data. During clock period 3, OR gate 324 also generates a combined write enable signal (inactive) from the write enables stored in register 313 (process step 530).

During clock period 4, the 13-bit address, the calculated parity bit, and the inactive combined write enable signal (i.e., a read signal) are stored in registers 321–323. The 13-bit read address and the combined write enable signal are applied to parity SRAM 330. Since the combined write enable signal from register 323 indicates a read transaction, parity SRAM 330 does not store the newly generated parity, but instead outputs the previously stored parity bit associated with the selected read data (process step 540).

During clock period 5, the selected parity bit retrieved from parity SRAM 330 and the calculated parity bit from register 322 are stored in registers 331 and 332. Parity detector 340 then compares the two parity bits on the outputs of registers 331 and 332 and generates a parity error if the parity bits are different (process step 550).

Although the present invention has been described in detail, those skilled in the art should understand that they can make various changes, substitutions and alterations herein without departing from the spirit and scope of the invention in its broadest form.

What is claimed is:

1. For use in a data processor, a cache memory comprising:
   a first static random access memory (SRAM) capable of receiving on a plurality of inputs up to N incoming bytes of data and storing said up to N incoming bytes of data in a plurality of N-byte addressable locations, wherein M incoming bytes of data may be written in each of said plurality of N-byte addressable locations during a write operation, and wherein M written bytes of data and N–M unwritten bytes of data are output from each N-byte addressable location on a plurality of outputs of said first SRAM during said write operation; and
   a parity generator coupled to said first SRAM capable of receiving during said write operation said M written bytes of data and said N–M unwritten bytes of data and generating therefrom at least one write parity bit associated with said M written bytes of data and said N–M unwritten bytes of data.

2. The cache memory as set forth in claim 1 further comprising a second SRAM coupled to said parity generator capable of storing said at least one write parity bit during said write operation.

3. The cache memory as set forth in claim 2 wherein said first SRAM receives R write enable signals capable of selecting at least one of N bytes in each of said plurality of N-byte addressable locations in which incoming bytes of data are to be written.

4. The cache memory as set forth in claim 3 wherein R=N such that a single incoming byte of data may be written into an individual selectable one of said N bytes in each of said plurality of N-byte addressable locations.

5. The cache memory as set forth in claim 2 wherein said at least one write parity bit comprises a single parity bit associated with said M written bytes of data and said N–M unwritten bytes of data.

6. The cache memory as set forth in claim 2 wherein said at least one write parity bit comprises a first parity bit associated with a first one of N bytes in each of said plurality of N-byte addressable locations and a second parity bit associated with a second one of said N bytes in each of said plurality of N-byte addressable locations.

7. The cache memory as set forth in claim 2 wherein said first SRAM is capable of receiving during a read operation a read address selecting a first one of said plurality of N-byte addressable locations, wherein said first SRAM, in response to receipt of said read address, outputs on said plurality of outputs N bytes of data retrieved from said first N-byte addressable location, and wherein said parity generator generates at least one read parity bit associated with said retrieved N bytes of data.

8. The cache memory as set forth in claim 7 further comprising a parity error detector, wherein said second SRAM receives said read address and, in response to receipt of said read address, outputs said at least one write parity bit associated with said read address, and wherein said parity detector compares said at least one read parity bit and said at least one write parity bit.

9. A processing system comprising:
at least one user input/output device capable of receiving inputs from a user;
a monitor capable of displaying images to the user;
a memory capable of storing user data and executable programs; and
a data processor capable of executing said executable programs, said data processor containing a cache memory comprising:
a first static random access memory (SRAM) capable of receiving on a plurality of inputs up to N incoming bytes of data and storing said up to N incoming bytes of data in a plurality of N-byte addressable locations, wherein M incoming bytes of data may be written in each of said plurality of N-byte addressable locations during a write operation, and wherein M written bytes of data and N−M unwritten bytes of data are output from each, N-byte addressable location on a plurality of outputs of said first SRAM during said write operation; and
a parity generator coupled to said first SRAM capable of receiving during said write operation said M written bytes of data and said N−M unwritten bytes of data and generating therefrom at least one write parity bit associated with said M written bytes of data and said N−M unwritten bytes of data.

10. The data processor as set forth in claim 9 further comprising a second SRAM coupled to said parity generator capable of storing said at least one write parity bit during said write operation.

11. The data processor as set forth in claim 10 wherein said first SRAM receives R write enable signals capable of selecting at least one of N bytes in each of said plurality of N-byte addressable locations in which incoming bytes of data are to be written.

12. The data processor as set forth in claim 11 wherein R=N such that a single incoming byte of data may be written into an individual selectable one of said N bytes in each of said plurality of N-byte addressable locations.

13. The data processor as set forth in claim 10 wherein said at least one write parity bit comprises a single parity bit associated with said M written bytes of data and said N−M unwritten bytes of data.

14. The data processor as set forth in claim 10 wherein said at least one write parity bit comprises a first parity bit associated with a first one of N bytes in each of said plurality of N-byte addressable locations and a second parity bit associated with a second one of said N bytes in each of said plurality of N-byte addressable locations.

15. The data processor as set forth in claim 10 wherein said first SRAM is capable of receiving during a read operation a read address selecting a first one of said plurality of N-byte addressable locations, wherein said first SRAM, in response to receipt of said read address, outputs on said plurality of outputs N bytes of data retrieved from said first N-byte addressable location, and wherein said parity generator generates at least one read parity bit associated with said retrieved N bytes of data.

16. The data processor as set forth in claim 15 further comprising a parity error detector, wherein said second SRAM receives said read address and, in response to receipt of said read address, outputs said at least one write parity bit associated with said read address, and wherein said parity detector compares said at least one read parity bit and said at least one write parity bit.

17. For use a cache memory, a method of generating parity for data stored in the cache memory comprising the steps of:
receiving up to N incoming bytes of data on a plurality of inputs of a first static random access memory (SRAM) comprising a plurality of N-byte addressable locations;
storing the up to N incoming bytes of data in a first N-byte addressable location, wherein M incoming bytes of data may be written in the first N-byte addressable location during a write operation;
retrieving M written bytes of data and N−M unwritten bytes of data from the first N-byte addressable location during the write operation and outputting the retrieved M written bytes of data and N−M unwritten bytes of data on a plurality of outputs of the first SRAM; and
generating at least one write parity bit associated with the M written bytes of data and the N−M unwritten bytes of data output from the first SRAM during the write operation.

18. The method as set forth in claim 17 further comprising the step of storing the at least one write parity bit in a second SRAM during the write operation.

19. The method as set forth in claim 18 wherein the at least one write parity bit comprises a single parity bit associated with the M written bytes of data and the N−M unwritten bytes of data.

20. The method as set forth in claim 18 wherein the at least one write parity bit comprises a first parity bit associated with a first one of N bytes in the first N-byte addressable location and a second parity bit associated with a second one of the N bytes in the first N-byte addressable location.

21. The method as set forth in claim 18 further comprising the steps of:
receiving a read address on the plurality of inputs of the first SRAM during a read operation, the read address capable of selecting the first N-byte addressable location;
outputting on the plurality of outputs of the first SRAM N bytes of data retrieved from the first N-byte addressable location; and
generating at least one read parity bit associated with the retrieved N bytes of data.

22. The method as set forth in claim 21 further comprising the steps of:
receiving the read address in the second SPAM;
in response to receipt of the read address in the second SRAM, outputting the at least one write parity bit associated with the read address; and
comparing the at least one read parity bit and the at least one write parity bit.

* * * * *